(12) United States Patent
Roosli et al.

(10) Patent No.: US 7,822,349 B2
(45) Date of Patent: Oct. 26, 2010

(54) DIGITAL ITERATIVE GAIN CONTROL

(75) Inventors: Philipp Roosli, Mountain Lake, NJ (US); Ralph Giffone, Boomfield, NJ (US); Hazrat Shah, Newark, NJ (US)

(73) Assignee: Inncom International, Inc., Niantic, CT (US)

( * ) Notice: Subject to any disclaimer, the term of this patent is extended or adjusted under 35 U.S.C. 154(b) by 1472 days.

(21) Appl. No.: 10/631,457

(22) Filed: Jul. 30, 2003

(65) Prior Publication Data

US 2004/0022334 A1 Feb. 5, 2004

Related U.S. Application Data

(60) Provisional application No. 60/400,480, filed on Aug. 1, 2002.

(51) Int. Cl.
*H04B 10/06* (2006.01)

(52) U.S. Cl. .......... 398/202; 398/127; 398/128; 398/130; 398/209; 398/210; 398/135; 398/136; 398/138; 375/345; 375/316; 250/214 A; 250/214 B; 250/214 AG; 250/214 LA; 330/308; 330/59

(58) Field of Classification Search .......... 398/202, 398/209, 210, 208, 127, 128, 130, 135, 136, 398/137, 138, 25, 26, 27; 375/345, 316, 375/317, 318, 295; 250/214 A, 214 B, 214 AG, 250/214 R, 214 C, 214 LA; 330/308, 59
See application file for complete search history.

(56) References Cited

U.S. PATENT DOCUMENTS

| | | | |
|---|---|---|---|
| 1,719,845 A | 7/1929 | De Loss | |
| 4,216,430 A | 8/1980 | Amazawa et al. | 455/219 |
| 4,555,702 A * | 11/1985 | Matsuura et al. | 340/825.64 |
| 5,016,205 A | 5/1991 | Shumway | 364/715.01 |
| 5,023,943 A | 6/1991 | Heberle | 455/603 |
| 5,036,527 A | 7/1991 | Hamlin et al. | 375/98 |
| 5,113,438 A | 5/1992 | Blokker, Jr. et al. | 380/6 |
| 5,128,792 A | 7/1992 | Teich et al. | 359/161 |
| 5,329,243 A | 7/1994 | Tay | 330/136 |
| 5,383,044 A | 1/1995 | Borchardt et al. | 359/145 |
| 5,506,715 A * | 4/1996 | Zhu | 398/111 |
| 5,679,953 A * | 10/1997 | Ananth et al. | 250/338.1 |
| 5,790,295 A * | 8/1998 | Devon | 398/202 |
| 5,808,760 A * | 9/1998 | Gfeller | 398/27 |
| 5,828,300 A * | 10/1998 | Addy et al. | 340/539.16 |
| 5,841,385 A | 11/1998 | Xie | 341/139 |
| 5,864,591 A * | 1/1999 | Holcombe | 375/345 |
| 5,892,472 A * | 4/1999 | Shu et al. | 341/139 |
| 5,914,478 A * | 6/1999 | Bridgelall | 235/462.25 |
| 6,081,558 A * | 6/2000 | North | 375/316 |
| 6,112,119 A | 8/2000 | Schuelke et al. | 607/9 |
| 6,229,433 B1 | 5/2001 | Rye et al. | 340/310.01 |

(Continued)

OTHER PUBLICATIONS

"Wireless Infrared Communications"; Authors: Joseph M. Kahn and John R. Barry; Proceedings of the IEEE, vol. 85, No. 2; Feb. 1997; pp. 265-298.

*Primary Examiner*—Hanh Phan
(74) *Attorney, Agent, or Firm*—Cantor Colburn LLP

(57) ABSTRACT

In an IR communication network, a method is described to optimize channel performance in the presence of strong and varying IR interference. The method controls of the channel gain based on quantitative measurement of the channel noise.

13 Claims, 7 Drawing Sheets

U.S. PATENT DOCUMENTS

| | | | |
|---|---|---|---|
| 6,271,831 B1 | 8/2001 | Escobosa et al. | 345/158 |
| 6,337,913 B1 | 1/2002 | Chang | 381/14 |
| 6,360,090 B1 | 3/2002 | Holcombe et al. | 455/307 |
| 7,016,612 B1 * | 3/2006 | Ikeda et al. | 398/137 |
| 2002/0089729 A1 * | 7/2002 | Holcombe | 359/189 |
| 2003/0171108 A1 * | 9/2003 | Eichin et al. | 455/307 |
| 2004/0208652 A1 * | 10/2004 | Nagatomo et al. | 398/210 |

* cited by examiner

DIGITAL ITERATIVE GAIN CONTROL

CROSS-REFERENCE TO RELATED APPLICATIONS

This application claims the benefit of U.S. provisional application No. 60/400,480, filed Aug. 1, 2002 the contents of which are incorporated by reference herein in their entirety.

BACKGROUND OF THE INVENTION

The present invention is related to optical communication, and more particularly to wireless communications using infrared (IR) wavelength transmitters and receivers.

IR communication is often favored over radio frequency (RF) wireless communication for relatively short distances because of its immunity to most sources of noise. The IR signals are also easily contained within a room, as they do not penetrate walls. This limitation is actually a significant advantage in multi-dwelling buildings such as hotels and apartment buildings, as the signal from one room will not interfere with the signals in another room One popular application for IR communication within rooms is for the control of appliances, such as TV and lights. Other applications include the exchange of data for burglar alarms system, access control systems, temperature controls and the like. In most of these applications, it is advantageous to work in the non-directional, diffuse mode of communications, where the link is not limited to line-of-sight alignment between the components that participate in the communication (the network nodes). Such systems depend on bouncing the IR signals from walls and ceiling, thus establishing a link between the nodes.

Due to the significant attenuation of IR signals with each bounce and with distance, diffuse mode communication requires high power levels of IR transmission and high sensitivity on the IR receiver side. The power that can be applied to the IR transmitter is limited by the rating of commercially affordable IR LEDs and safety considerations that preclude the use of lasers. It is thus of significant benefit to obtain high sensitivity IR receivers.

The theoretical limits on the ability of a receiver to retrieve a useable signal are determined by the ratio of the signal's strength to the strength of the prevailing noise (Signal to Noise Ratio, or SNR). In IR systems, the dominant noise is caused by ambient light sources such as the sun and incandescent and fluorescent lamps. Noise generated by close-by fluorescent lamps is intrusive for IR signal reception, as it presents high levels of energy in the optical wavelength of the IR signal. Fluorescent lamps that use electronic high-frequency ballasts are particularly troublesome, as they generate IR noise with modulation characteristics that are similar to the modulation schemes found to be most effective for IR communication networks.

One known method of increasing the sensitivity of a receiver is through the use of automatic gain control (AGC). For example, U.S. Pat. No. 1,719,845 to Martin teaches the use of AGC to compensate for weak radio signals. The amplitude of the detected RF signal is used to change the gain of the RF amplifier so that, when a smaller signal is received, the gain of the amplifier is increased to materially compensate for the smaller signal.

U.S. Pat. No. 4,216,430 to Kiyoshi describes an amplifier where the gain is controlled by the amplitude of the noise signal being received. A band-pass filter separates pulse noises from the normal audio signal. When the separated noise signal exceeds a preset threshold, the gain of the amplifier is momentarily reduced to prevent the noise from creating objectionable output.

U.S. Pat. No. 5,036,527 to Halim provides an AGC method where the gain of the amplifier is changed in digital steps based on the level of the signal. The incoming signal is compared against two fixed thresholds, and the gain is incremented or decremented depending whether the signal is larger than the higher threshold or smaller than the lower threshold.

U.S. Pat. No. 5,329,243 to Tay separates noise from signal using band-pass filter, and reduces the dynamic range of the AGC if a high level of noise is detected to prevent the noise from being amplified to an annoying level. The frequency response of the amplifier is also altered to attenuate high-frequency noise under these conditions.

U.S. Pat. No. 6,112,119 to Schuelke et al discloses an AGC method useable in amplifiers for sensing cardiac events. Due to the rhythmic nature of the expected signals, the gain is increased when an excessive period of time has elapsed without receiving cardiac signals.

The above examples of AGC provide methods to reduce the amplitude of the signal, or of the noise, which is mixed in with the signal, based on the amplitude of the incoming signal or noise. Where noise amplitude is used as the criterion for the gain setting, the noise is separated from the incoming signal through its frequency characteristics that allow the circuitry to distinguish noise from signal. For example, in the case of the Kiyoshi patent, a band-pass filter is used for the separation.

However, in IR communication systems used in the vicinity of man-made light sources, the dominant noise source is shot noise. Shot noise is white noise containing constant noise power per hertz of bandwidth. Such noise can not be readily distinguished from the data by its physical attributes, as the most common modulation techniques used for IR communication use pulse position modulation (PPM) or variants of that method. Data encoded in PPM appears with the same time and frequency characteristics as the peaks of shot noise. If the shot noise is present in strong enough amplitude, it can effectively block communications of the IR system.

The presence of some shot noise in a PPM data signal can be filtered using software algorithms. U.S. Pat. No. 5,128,792 to Teich titled "Self-Synchronizing IR Communication System" describes the use of a special PPM code that allows the IR receiver to recognize a packet of data even if it includes noise. The limitation of the Teich system is that it encumbers the decoding function of the receiver. The microprocessor in the receiver requires a large program and resources, while the data throughput is only a fraction what a non-noise-resistant code would provide with the same bandwidth.

SUMMARY OF THE INVENTION

The above-described deficiencies of the prior art are overcome or alleviated by a wireless communication system comprising a transmitter and a receiver, wherein the receiver has a digitally controllable gain. The gain is iteratively adjusted until a preset level of noise is received in a unit of time when there is no data transmission. In one aspect of the invention, the communication channel uses infrared. In another aspect of the invention, the noise is primarily shot noise. In another aspect of the invention, the setting of the gain is linked to external events. In another aspect of the invention, the receiver separates noise from data based on the validity of the decoded data packets. In another aspect of the invention, the sampling period for noise pulses is significantly longer than the length of a data packet. In another aspect of the invention, the gain of the receiver is attenuated to measure the margin of signal that is available.

BRIEF DESCRIPTION OF THE DRAWINGS

Referring now to the drawings wherein like numerals designate like components.

DETAILED DESCRIPTION OF THE PREFERRED EMBODIMENT

Figure 1:
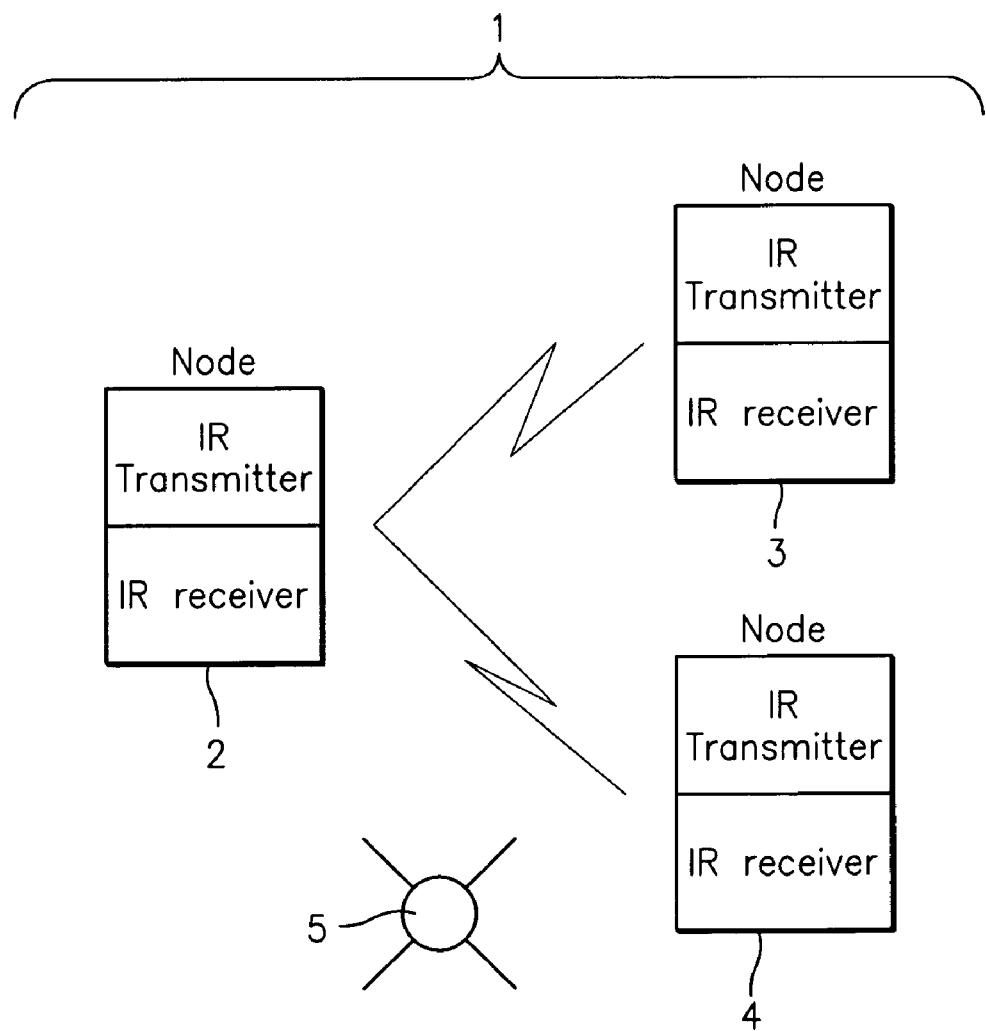
FIG. 1 is a block diagram of an IR communication network.

With reference to FIG. 1, an IR network 1 comprises at least two nodes identified as 2 and 3. Additional nodes such as 4 can be included. Each node 2, 3, and 4 includes an IR transmitter 6 and an IR receiver 7. The network 1 may be required to operate in the presence of IR interference sources such as a fluorescent and/or incandescent lamp 5. The IR signal that is transmitted, for example, from node 2 arrives at node 4 mixed with noise generated by lamp 5.

The IR receiver 7 is useable, for example, in an IR communication network used for the exchange of data and the control of apparatus in a space defined by the wails of a room. Each node 2, 3, or 4 can initiate a communication session, where it sends information or commands to another node 2, 3, or 4. The addressed node 2, 3, or 4 may respond in half-duplex protocol, after the completion of the transmission of the packet from the initiating node. Before initiating a new session, a node verifies that there are no sessions in progress by listening to the IR data and waiting for a preset duration of a lull.

Figure 2:
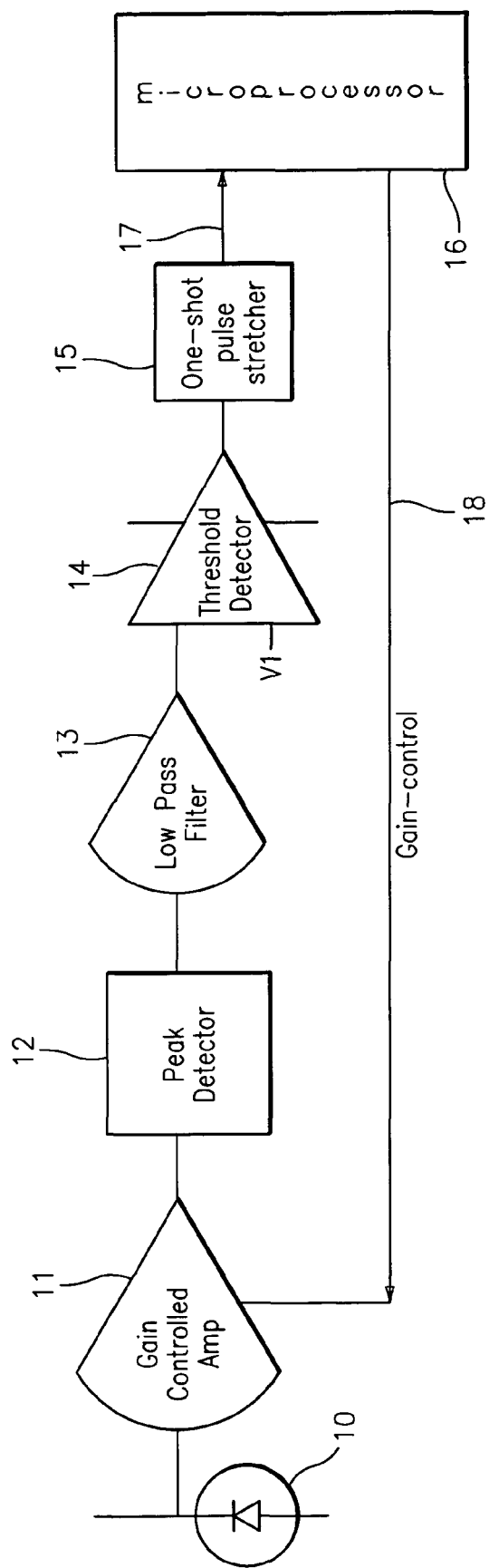
FIG. 2 is a simplified block diagram of an IR receiver that uses AGC.

FIG. 2 is a simplified block diagram of the IR receiver 7 that is incorporated into each node 2, 3, and 4. The receiver 7 is optimized for operation in a single sub-carrier modulation technique discussed in "Wireless Infrared Communications" by J. M. Kahn and. J. R. Barry, published in the Proceedings of the IEEE, Vol. 85, No. 2, Feb. 1997, p 287, which is incorporated by reference herein in its entirety. The received IR signal is captured by photodiode 10, and is linearly amplified by gain-controlled-amplifier 11. The amplitude-modulated signal is demodulated by peak detector 12, and the sub-carrier high frequency is stripped off by low-pass filter 13. The resulting baseband pulses that exceed a preset amplitude threshold V1 are amplified to a digital signal by threshold detector 14, and are stretched to a uniform pulse width through one-shot pulse stretcher 15. The output of 15 is fed to microprocessor 16. The microprocessor 16 provides an output 18 that controls the gain of amplifier 11. The design of gain-controlled amplifiers is well know in the art.

The signal that is processed by the IR receiver 7 ends up in the form of pulses, which are fed to the microprocessor 16. The timing of the individual pulses contains the encoded information. The receiver 7 can readily separate a packet of data from a burst of noise, as the data has to fit a rigid format and the data contained in the packet is verifiable through a cyclical redundancy check (CRC) or other methods of verification, embedded In the packet. Receipt of an invalid packet does not automatically imply that it is pure noise, though—it could be a data packet that was affected by noise. Receiving a signal stream that is longer than the duration of an expected packet, on the other hand, is a clear indication that the signal content is noise.

As will be discussed in further detail hereinafter, the receiver's gain is adjusted based on the incoming rate of noise. The streams of pulses that are received are counted over a preset period of time. If the pulse stream results in a valid packet decode, the pulses are assumed to be data rather than noise. If, during the preset count period no valid data was received, the pulses are assumed to be noise.

When the noise count exceeds a preset value, the gain of the receiver 7 is reduced by a step. The process is repeated until the noise count drops below the preset value. If the noise count is maintained at a level that is below the preset level for duration of time, the gain is increased to maintain the noise level close to the preset value.

As can be seen from the above, the receiver 7 design thus allows the microprocessor 16 to vary the gain of the IR signal that is received. If the amplitude of the signal is attenuated to the point where the output of filter 13 is less than V1, no signal will be received by the microprocessor 16 altogether. As the gain is increased, the stronger pulses being received by photodiode 10 will start arriving at input 17 of the microprocessor 16.

With a goal of maintaining the output noise level of the receiver 7 to a preset value, the control algorithm is not unlike a servo control loop, which maintains an output at a desired value. Due to the statistical nature of noise, some time integration is required to prevent wild swings in the gain. To make the control loop responsive to changes, the loop should recognize rates of change, as well as be proportional to the absolute value of the noise count.

Figure 3:
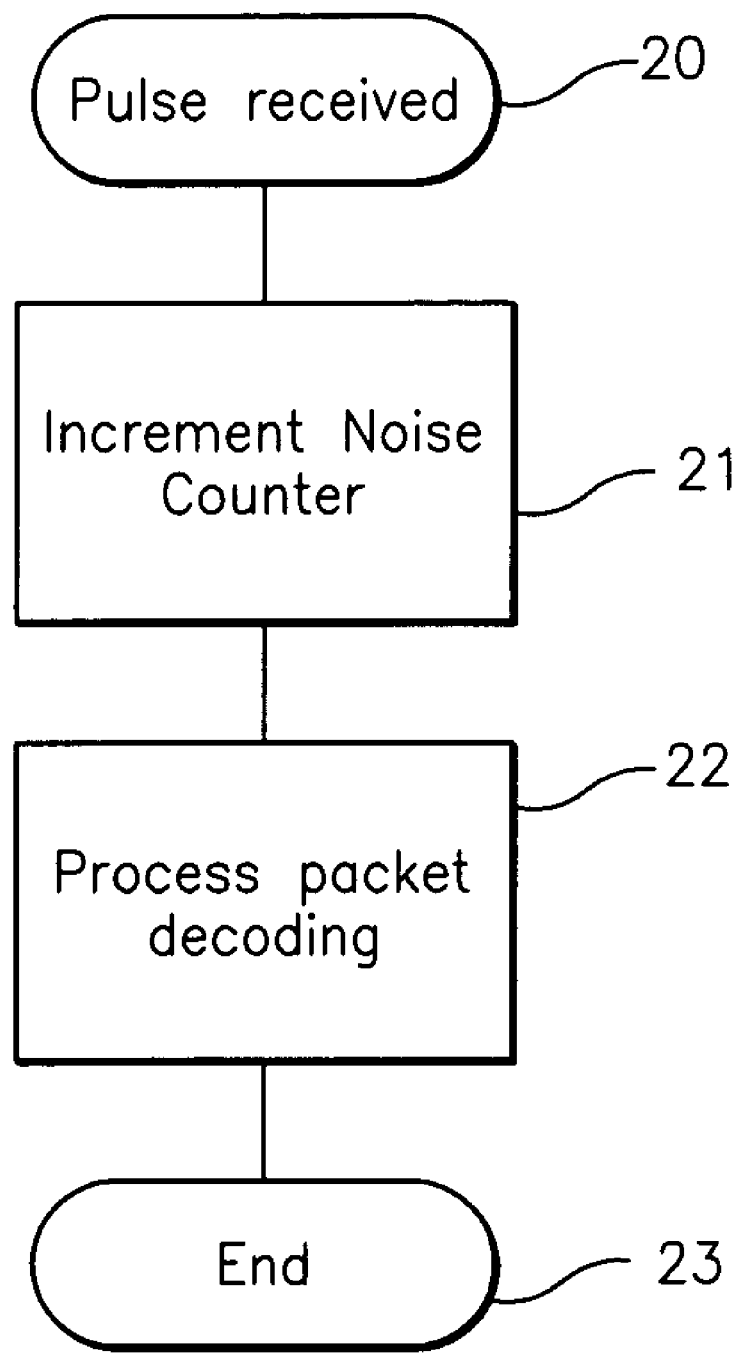
FIG. 3 is a flow chart of the processing of an incoming IR pulse.

FIG. 3 depicts an interrupt-driven routine 19 performed by microprocessor 16 for processing each pulse received by microprocessor 16. When a pulse 20 is received, a Noise Counter is incremented in step 21. The new pulse is added to previously received pulses and a decode attempt is made in step 22. A successful decode of a completed packet will impact subsequent processing. The pulse processing routine is then exited in step 23.

Figure 4:
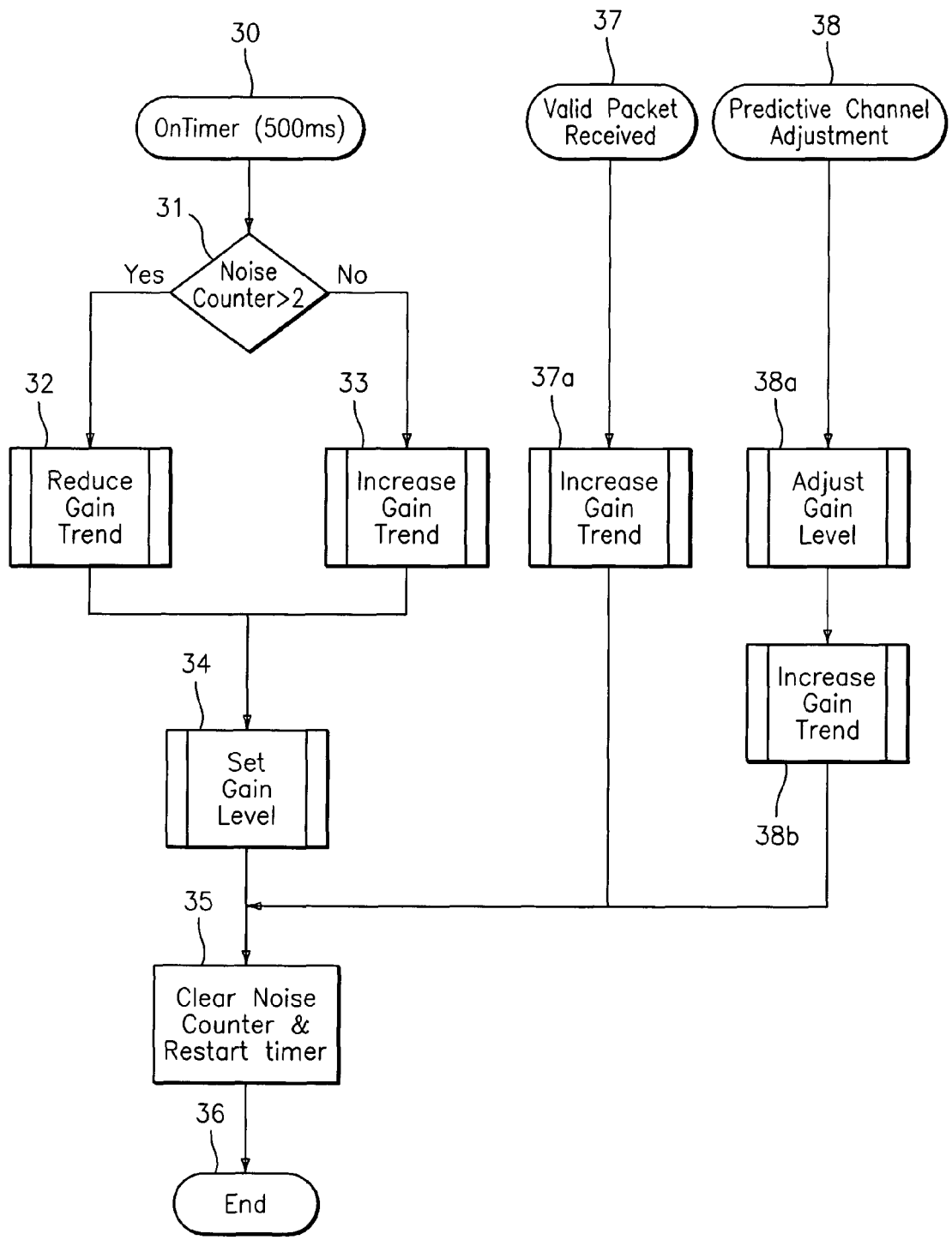
FIG. 4 is a flow chart of the main routines in the AGC program.

FIG. 4 shows the software routines that determine in what direction the gain should be modified (increase or decrease). This routine has three entry points: timer entry 30, Valid Packet entry 37 and Predictive Input entry 38.

A background timer will cause entry 30 into the processing routine every 0.5 seconds. The noise counter is then checked in step 31. If the noise count was more than 2 (meaning that more than 2 noise pulses were received in the last 0.5 seconds), a "Reduce Gain Trend" routine is entered in step 32. If the noise count was 2 or less, an "Increase Gain Trend" routine will be entered in step 33. The gain is then set by calling the "Set Gain Level routine in step 34, followed by the noise counter being set to zero and the timer being restarted in step 35. The routine is then exited in step 36.

When a valid packet has been decoded in step 22 of FIG. 3, it is logical to assume that the gain of the amplifier is essentially satisfactory, although it is possible that the gain could be further increased without losing signal-to-noise performance. Returning to FIG. 4, the valid packet causes an entry 37 which will call a routine that will process a request to increase the gain trend 37a. The process then returns to the main branch at step 35, as previously discussed. It should be noted that a valid data packet comprises, for example, 9 to 35 pulses, with duration of less than 50 mSec.

Due to the random nature of noise, changes in the gain of the receiver are quite slow, as the purpose is to arrive at equilibrium where about four noise pulses are received every second. Turning on a fluorescent or incandescent lamp in close proximity to the receiver, however, will cause a large instantaneous increase in the noise level. In order to accelerate the response of the receiver gain to such a change, the microprocessor can enter the gain trend decision routine through the Predictive Input 38. The microprocessor may gain the information about the impending change in noise by the simple fact that it lust turned on an output that controls the noise source (or turned it off), or it may have received the information from another node in the network, or it may have a light sensor that is responsive to such noise sources. Once entered through step 38, the routine directly adjusts the gain level in step 38a, to reflect the new expected noise level, then proceeds to fine-tune the gain by the "Increase Gain Trend" routine in step 38b. The routine then joins the main procedure in step 35.

Figure 5:
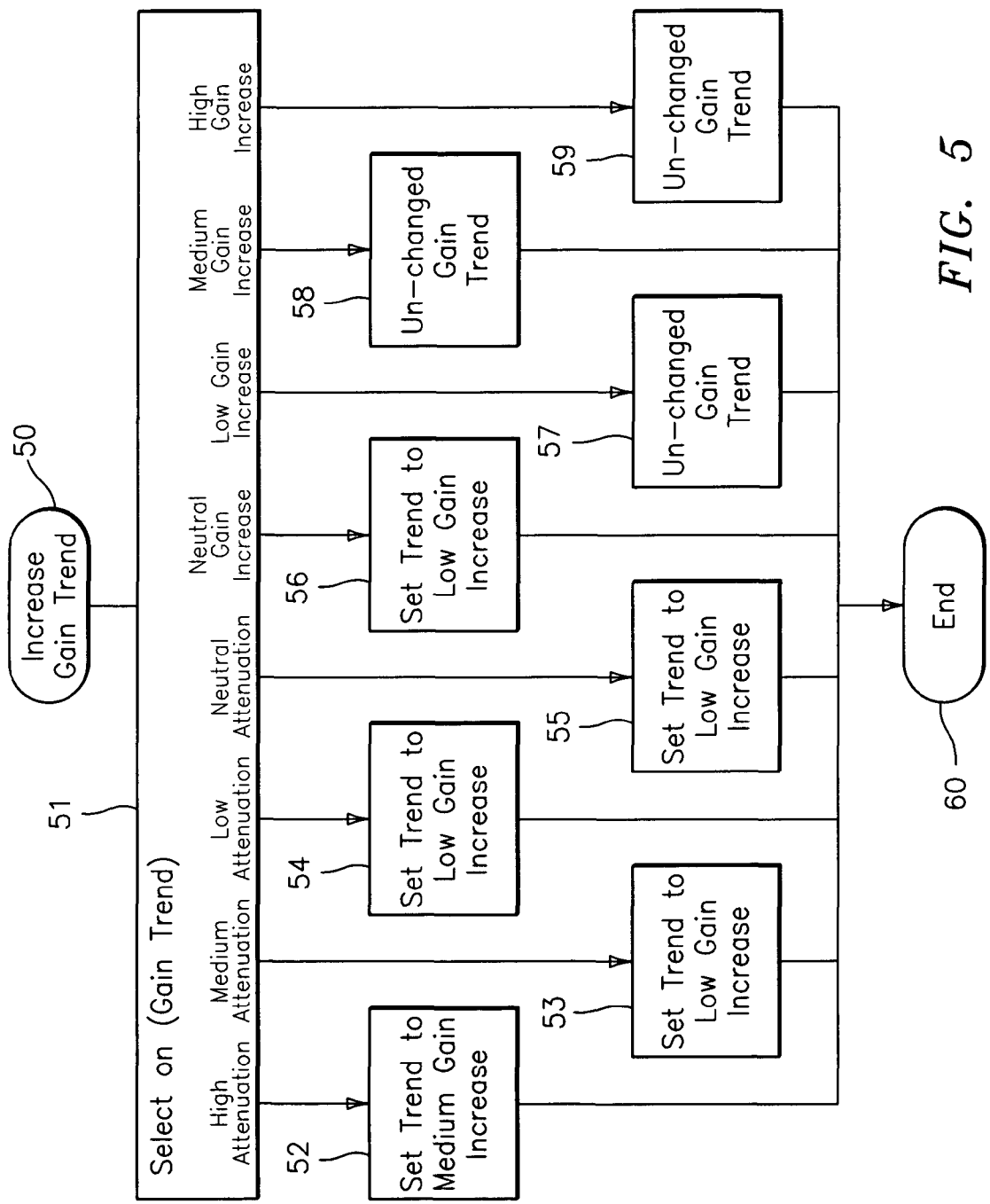
FIG. 5 is a flow chart of the processing of a low noise level.

In the previous steps, the gain trend was established to become either an increase or a decrease trend. FIG. 5 details the routine that sets the rate of change for the gain trend when an increase trend was called for is step 33.

The routine is entered in step 50, and branches to one of 8 actions depending on the current value of the gain trend. For example, if the current gain trend was at High Attenuation, the branch will proceed to step 52 where the gain trend will be set to a Medium Attenuation Increase. If, on the other hand, the current gain trend was for a High Gain Increase, the branch will proceed with step 59 where the gain will be unchanged. Thus, the request to increase the gain trend initiated in step 33 will set the trend to a value ranging from a medium gain increase, through a low gain increase, to a no-gain change if the trend was already in the low, medium or high gain increase trend. The routine exits at step 60 and returns control of the program to step 34 in FIG. 4.

Figure 6:
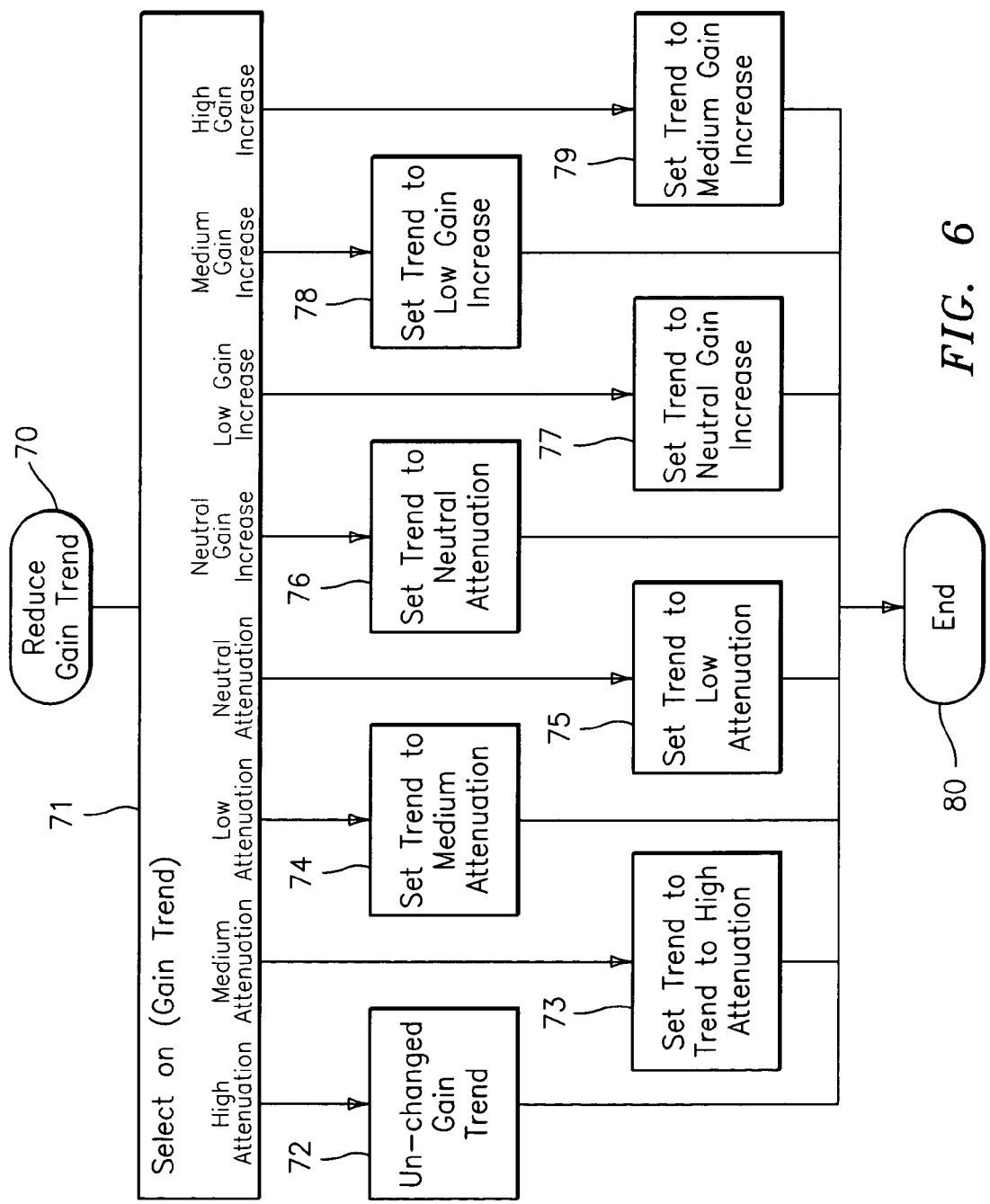
FIG. 6 is a flow chart of the processing of a high noise level.

If a noise count that is higher than the desired level was received in the main routine of FIG. 4, the program branches in step 32 to reduce the gain trend. This is executed in the program of FIG. 6. Entering the routine in step 70, the program branches in step 71 in a manner identical to the one described for the Increase Gain Trend routine 50. Depending on the current level of gain trend (ranging from High attenuation to High gain), the program will branch through one of the steps 72-79. The gain trend will either emerge unchanged, placed in high, medium or low attenuation, or set to increase in a neutral, low or medium gain increase trend. The routine exits at 80, to return to the main routine step 34 in FIG. 4, where the gain setting is computed and set.

Figure 7:
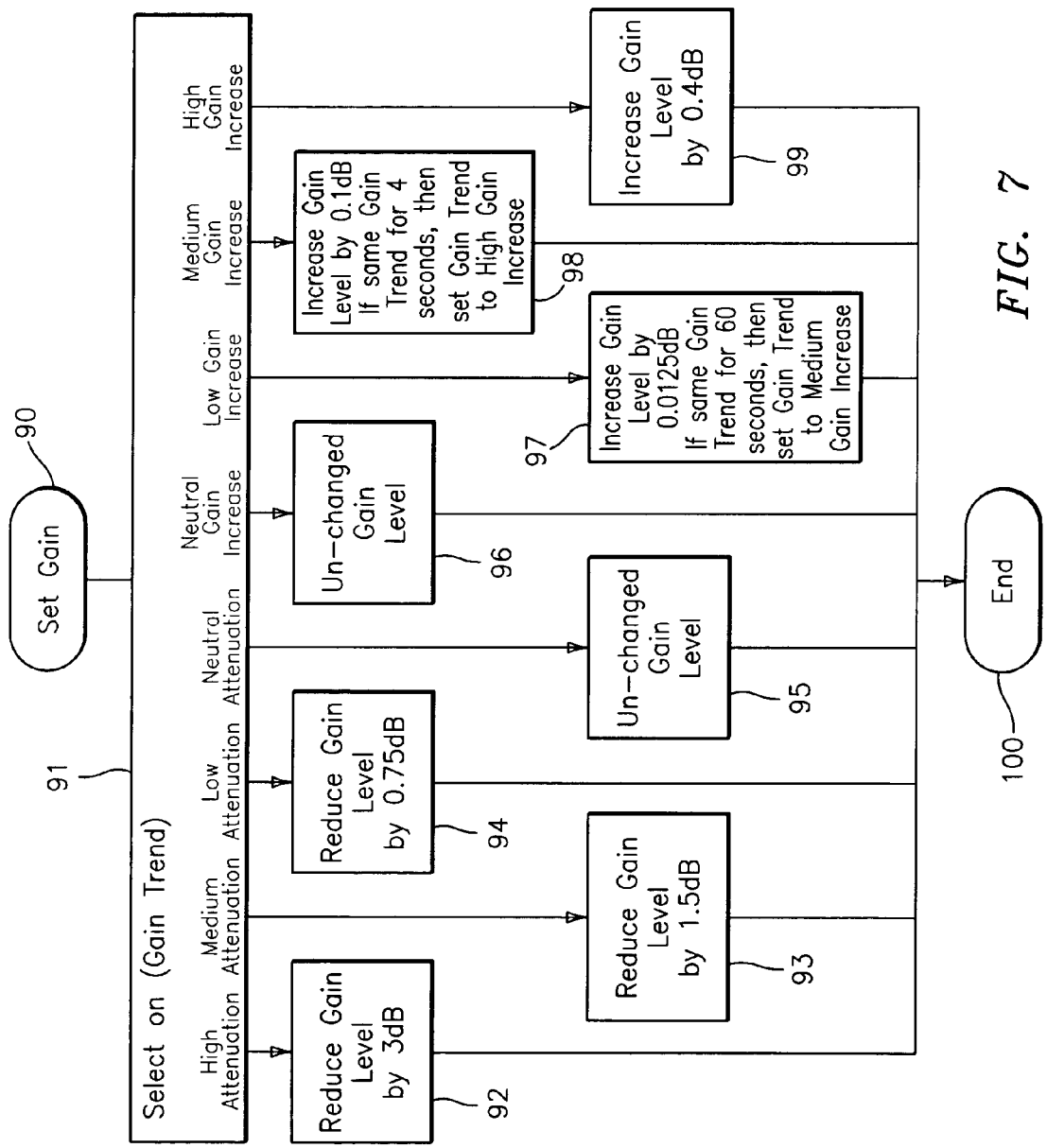
FIG. 7 is a flow chart of computation and setting of the receiver gain.

FIG. 7 details the routine that sets the receiver gain (step 34 in of FIG. 4). The routine is entered in step 90, and branches in step 91 in a manner similar to the previous routines. Whereas the previous two routines modified the gain trend, this routine uses the gain trend to modify the actual gain of the receiver. Unlike the previous two routines where the action was dependent solely on the current gain trend, the routine 90 also considers the length of time that the current gain trend has been maintained before it increases the gain. Increases in noise levels need to be addressed relatively quickly, as these may have been caused by a noise source such as a lamp having been turned on, and they can effectively block the communication channel. A reduction in the noise level to a level where the noise practically disappears needs to be handled slowly, else the noise output from the receiver will immediately swamp the microprocessor.

If the gain trend was set at High Attenuation, step 91 will branch to step 92, where the gain will be set to a level that is lower than the current gain by 3 dB. Likewise. Medium or Low attenuation trend values will cause branches to steps 93 and 94, where the gain will be reduced by 1.5 dB or 0.75 dB, respectively. A gain trend of Neutral attenuation or Neutral Gain Increase will cause branches to steps 95 or 96, respectively, and the gain will stay unchanged. If the gain trend value is set to High Gain Increase, the routine will branch at step 91 to step 98, where the gain is increased by 0.4 dB.

If the gain trend value is set to Low Gain Increase, the routine will branch at step 91 to step 97. The gain is increased by 0.0125 dB, and a timer is consulted. If the timer shows that the current gain has been unchanged for the last 60 seconds, the gain trend is set to Medium Gain Increase.

If the gain trend value is set to Medium Gain Increase, the routine will branch at step 91 to step 98. The gain is increased by 0.1 dB. If the timer shows that the current gain has been unchanged for the last 4 seconds, the gain trend is set to High Gain Increase. Regardless which way the routine branches, it will exit with step 100, which returns control to step 35 in FIG. 4.

The above-described algorithm for the control of the gain of an IR amplifier has been determined through experimentation to provide an optimum performance. If the sensitivity of the receiver is adjusted to as little as 0.5-1.0 dB above the noise floor, then most noise pulses are eliminated and communication will be quite reliable. It should be noted that the smaller steps of gain adjustment mentioned in steps 97 and 98 may be accumulated before they are acted on, or they may be replaced with the smallest actual step that the receiver Is capable of handling.

The above-described invention provides a relatively noise-free IR communication channel, while maintaining the channel gain at the highest possible level. This allows fast and reliable communications within the network, with relatively low-cost components and significantly simpler decoding algorithms, in close proximity to such sources of interference as incandescent and fluorescent lamps.

An additional benefit of the microprocessor-continuer gain is its use for testing the signal margin available between each pair of nodes. Once the noise level has been established by the receiver ("noise floor"), the test program reduces the receiver gain iteratively until the link communication breaks down. The difference in the gain between the gain setting for the noise floor to the setting of the gain when the link breaks down is the operating margin of the link. Good engineering practices require a margin of at least 3 db to prevent a marginal setup that may result in unreliable operation.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A wireless communication system comprising
a transmitter; and a receiver;

the receiver having a digitally controllable gain;

the gain being iteratively adjusted based on a combination of reception noise, correctly received data packets, and quiet reception intervals.

2. The communication system of claim 1, where a communication channel uses IR.

3. The communication system of claim 1, where the gain is iteratively adjusted until a preset level of noise is received in a predetermined unit of time and where the reception noise is primarily shot noise.

4. The communication system of claim 3, where the preset level of noise is a number of noise pulses per second.

5. The communication system of claim 3, where a sampling period for noise pulses is longer than the length of a data packet.

6. The communication system of claim 1, where adjustment of the gain is linked to an external event.

7. The communication system of claim 1, where the receiver separates noise from data based on validity of decoded data packets.

8. The communication system of claim 1, where the gain of the receiver is attenuated to measure a margin of signal that is available.

9. A wireless communication system, comprising a transmitter from which a transmitter signal is transmittable; and a receiver which is configured to receive multiple signals and noise and to operate during otherwise quiet periods when no signals or noise is received, wherein, in an event a received one of the multiple signals is reflective of the transmitter signal or a current period is quiet, a sensitivity of a gain of the receiver is increased, and, in an event the received one of the multiple signals is not reflective of the transmitter signal or the receiver is receptive of the noise, the sensitivity is decreased.

10. The wireless communication system according to claim 9, wherein the transmitter signal comprises a data packet.

11. The wireless communication system according to claim 9, wherein the gain is digitally controllable.

12. The wireless communication system according to claim 9, wherein the sensitivity is increased/decreased by a corresponding increase/decrease in a gain adjustment interval.

13. A wireless communication system, comprising a transmitter from which a transmitter signal is transmittable;

a receiver which is configured to receive multiple signals and noise and to operate during otherwise quiet periods when no signals or noise is received; and a microprocessor coupled to the receiver to determine whether a received one of the multiple signals is reflective of the transmitter signal, whether a current period is quiet and whether the receiver is receptive of the noise, to increase a sensitivity of a gain of the receiver if the received one signal is reflective of the transmitter signal or the current period is quiet, and to decrease the sensitivity if the received one signal is not reflective of the transmitter signal or the receiver is receptive of the noise.

* * * * *